United States Patent
Yamamoto et al.

(10) Patent No.: US 6,662,353 B2
(45) Date of Patent: Dec. 9, 2003

(54) SYSTEM AND PROGRAM FOR ESTIMATING PERSON-HOURS REQUIRED TO PREPARE A PATTERN FILM OF A CIRCUIT TO BE PRINTED ON A BOARD

(75) Inventors: Junichi Yamamoto, Tokyo (JP); Sachio Henmi, Tokyo (JP); Shigemitsu Fujisawa, Tokyo (JP); Masanobu Sakurai, Tokyo (JP); Kazuyuki Tajima, Tokyo (JP); Fumio Kobayashi, Tokyo (JP); Masaaki Ueno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 59 days.

(21) Appl. No.: 10/084,349

(22) Filed: Feb. 28, 2002

(65) Prior Publication Data
US 2003/0088846 A1 May 8, 2003

(30) Foreign Application Priority Data

Jul. 12, 2001 (JP) ........................................ 2001-211544

(51) Int. Cl.⁷ .................... G06F 17/50; G06F 17/60; G06F 19/00; G05B 19/18
(52) U.S. Cl. .......................... 716/14; 700/95; 700/96; 700/56; 705/400
(58) Field of Search ................ 716/14, 15; 700/95, 700/96, 56, 103; 705/400; 361/748, 760, 761

(56) References Cited

U.S. PATENT DOCUMENTS 5,170,554 A * 12/1992 Davis et al. .................. 29/832
5,258,915 A * 11/1993 Billington et al. ............ 700/103
5,579,231 A * 11/1996 Sudou et al. .................. 700/95
5,999,920 A * 12/1999 Sato et al. .................... 705/400
6,240,633 B1 * 6/2001 Kent et al. .................... 29/832
6,480,751 B1 * 11/2002 Kuribayashi et al. .......... 700/56
2003/0014139 A1 * 1/2003 Yokomori et al. ............. 700/96
2003/0015342 A1 * 1/2003 Sakamoto et al. ............ 174/250

* cited by examiner

Primary Examiner—Matthew Smith
Assistant Examiner—Magid Dimyan
(74) Attorney, Agent, or Firm—Rabin & Berdo, P.C.

(57) ABSTRACT

The present invention relates to an estimation system that can provide a highly reliable estimation result when the estimation system estimates person-hours required to prepare a film pattern for a circuit to be printed on a board. Upon receiving design conditions from a cline machine, a reference pin calculator of the estimation system calculates a number of reference pins on the basis of a total number of pins extending from parts to be integrated on the printed circuit board and a special specification requirement to be applied to the printed circuit. An additional pin calculator calculates a number of additional pins on the basis of a signal line wiring method. A total estimated pin calculator corrects a sum of the reference pins and the additional pins on the basis of design difficulty, which is determined from a number of signal layers to be made in the printed circuit, a number of signal lines arrangeable between adjacent pins and a pin density, to calculate a total estimated number of pins. A person-hour calculator calculates person-hours required to prepare a pattern film of the printed circuit by dividing the total estimated number of the pins by an average number of pins handleable by a design engineer per a unit time.

21 Claims, 3 Drawing Sheets

FUNDAMENTAL INFORMATION

| DEVICE NAME | | SUBSTRATE NAME | |
|---|---|---|---|
| DRAWING # | | REDESIGN COEF. | |
| # OF SUBSTRATE LAYERS | 12 | WIRING GRADE | 3 LINES ▼ |
| # OF SIGNAL LAYERS | 8 | TOTAL # OF PINS | 12000 |
| WIRING AREA | 90220 (mm²) | | |

SPECIAL SPECIFICATION

☐ BWB SUBSTRATE   ☐ PAPER-BASED SUBSTRATE
☐ 2-LAYER INTEGRATION   ☐ SINGLE SURFACE BOARD
OVERLAY WIRING  50 (%)   # OF BGAS  12

WIRING METHOD

| GUARD EARTH WIRING | (UNITS) | BUS WIRING | (UNITS) |
|---|---|---|---|
| PAIR WIRING | (UNITS) | AUTOMATIC WIRING | (UNITS) |
| PREDETERMINED WIRING LENGTH | (UNITS) | | |

OK    CANCEL

FIG. 3

```
PERSON-HOUR & PREPARATION DAY ESTIMATION FOR PCB
   WE APPRECIATE YOUR ORDER.
   < OUR ESTIMATION IS INDICATED BELOW. >

DEVICE NAME: NOT SPECIFIED    SUBSTRATE NAME: NOT SPECIFIED

DRAWING #: NOT SPECIFIED      REDESIGN COEF.: 1

# OF SUBSTRATE      # OF SIGNAL      WIRING AREA: 90,220 mm²
LAYERS: 12          LAYERS: 8

TOTAL # OF PINS: 12,000         WIRING GRADE: 3 LINES

PERSON-HOURS: 192.2 (HR)
              PREPARATION PERIOD: 22 (DAYS)
```

SYSTEM AND PROGRAM FOR ESTIMATING PERSON-HOURS REQUIRED TO PREPARE A PATTERN FILM OF A CIRCUIT TO BE PRINTED ON A BOARD

BACKGROUND OF THE INVENTION

1. Field of the Invention

The present invention relates to a system for estimating person-hours and days necessary to prepare a pattern film for a printed circuit board, and a program used therewith.

2. Description of the Related Art

When an electronic device such as a printed circuit board is manufactured, a client first designs a circuit having desired functions. A design engineer then receives a circuit diagram from the client and prepares a pattern film for the printed circuit board with a CAD (Computer Aided Design) technique on the basis of the circuit diagram.

During the pattern film preparation procedure, the design engineer checks design conditions (requirements), i.e., the number of wiring layers to be included in a product (printed circuit board), the number of parts to be integrated on the product, the types of the parts, the number of pins extending from the parts, the number of wiring (connections) to connect the parts, etc. The design engineer then determines the layout of major parts. Subsequently the design engineer performs a "preset" process to create fundamental wiring.

After the preset, automatic arrangement and automatic wiring are performed on the basis of the circuit design data. The design engineer tests the resulting wiring pattern on the pattern film, and corrects it if necessary. An artwork is then applied to the pattern film to create marks (indicia) on the pattern film. The preparation of the pattern film for the printed circuit board is thus complete.

In the above described preparation procedure for the pattern film of the printed circuit board, the design engineer activities are standardized and a computer fabricates (prepares) most of the detailed arrangement and wiring. Therefore, the person-hours of the design engineer can be easily estimated from the number of wiring layers on the printed circuit board (or the pattern film) and an estimation table. The estimation table provides the relationship between the number of the wiring layers and a total number of the pins extending from all the parts arranged on the printed circuit board.

In recent times, however, high-speed circuits adapted to operate with, for instance, a clock signal of several hundred MHz are marketed. Devices, such as BGA (Ball Grid Array) packages, having high-density wiring are also developed. The high-speed circuits and BGA packages impose a great amount of limitations on the arrangement and wiring on the printed circuit board.

For example, the length of wiring is limited (specified) in order to restrict a delay time of a signal, and the lengths of all the wiring should be the same in order to phase a plurality of signals. The width of the wiring pattern is also limited such that an impedance of the wiring has a particular value. Moreover, the arranging order of the pins connected to each signal line is limited.

The conventional CAD cannot automatically create a pattern film that meet the above described requirements. As a result, the automatic arrangement and automatic wiring are hardly possible to the pattern film of the high-speed, high-density printed circuit board. The design engineer must determine locations of the parts while paying a careful attention to the wiring in order to satisfy the design conditions when the design engineer prepares the pattern film. The design engineer thus creates a substantial part of the wiring pattern by a manual process. Only about 10% of the pattern film can be prepared by the automatic wiring process in a certain product. Consequently the estimation of the person-hours by the conventional approach, which determines the person-hours from the estimation table providing the relationship between the number of the signal layers and the total number of the pins to be made on the pattern film, significantly deviates from the actual person-hours. One example revealed that there is about 50% deviation between the estimated person-hours and the actual person-hours.

SUMMARY OF THE INVENTION

An object of the present invention is to provide an estimation system that presents estimation with higher reliability, and to provide an estimation program suitable for such estimation system.

According to one aspect of the present invention, there is provided an estimation system for estimating person-hours required to prepare a pattern film for a circuit to be printed on a board upon receiving a design condition, the system comprising: a reference pin calculation unit for calculating a number of reference pins on the basis of a total number of pins extending from parts to be integrated on a printed circuit board and a special specification requirement to be applied to a printed circuit; an additional pin calculation unit for calculating a number of additional pins on the basis of a signal line wiring method used in preparing the pattern film for the printed circuit; a total estimated pin calculation unit for correcting a sum of the number of the reference pins and the number of the additional pins on the basis of design difficulty to calculate a total estimated number of pins; and a person-hour calculation unit for calculating person-hours required to prepare the pattern film by dividing the total estimated number of the pins by an average number of pins handleable by a design engineer per a unit time. The design difficulty may be determined from a number of signal layers to be made in the printed circuit, a number of signal lines arrangeable between adjacent pins and a pin density. Since the total estimated number of the pins is corrected and obtained in consideration of various design factors, it is possible to estimate the person-hours at high accuracy.

According to a second aspect of the present invention, there is provided an estimation system for estimating person-hours required to prepare a pattern film for a circuit to be printed on a board based on a design condition, the system comprising: a correction table for setting a correction coefficient in accordance with a total number of pins extending from parts to be integrated on a printed circuit board; a specification table for setting a specification coefficient in accordance with a special specification to be applied to the printed circuit board; a wiring method table for setting an increment/decrement coefficient in accordance with a wiring method to be used to make signal lines on the pattern film; a difficulty table for setting a difficulty coefficient in accordance with a number of signal layers to be made on the printed circuit board, a number of signal lines arrangeable between adjacent pins and a pin density; a reference pin calculation unit for referring to the correction table to obtain a correction coefficient on the basis of a total number of pins indicated in the required design condition, referring to the specification table to obtain a specification coefficient on the basis of a special specification indicated in the required design condition, and multiplying the total number of pins indicated in the required design condition, the obtained correction coefficient and the obtained specification coefficient to calculate a number of reference pins; an additional pin calculation unit for referring to the wiring method table to obtain an increment/decrement coefficient on the basis of a signal line wiring method indicated in the required design condition, and calculating a number of additional pins on the basis of the obtained increment/decrement coefficient; a total estimated pin calculation unit for referring to the difficulty table to obtain a difficulty coefficient on the basis of information included in the required design condition, and correcting a sum of the number of the reference pins and the number of the additional pins on the basis of the difficulty coefficient and a reuse rate of a preceding wiring pattern, to calculate a total estimated number of pins; and a person-hour calculation unit for calculating the person-hours required to prepare the pattern film of the printed circuit by dividing the total estimated number of the pins by an average number of pins handleable by a design engineer per a unit time. Since the total estimated number of the pins is corrected and obtained in consideration of various design factors, it is possible to estimate the person-hours at high accuracy. Further, since various tables are included in the estimation system, it is easy to take advantage of data and experiences used in and obtained from existing pattern films, without changing an estimation program.

The estimation system may be included in a server of a server-client system, the server may be connected to the client via a network, and the design condition may be supplied to the server from the client via the network. The correction table, specification table, wiring method table, difficulty table, reference pin calculation unit, additional pin calculation unit, total estimated pin calculation unit and person-hour calculation unit may be included in the server, whereby the estimation of the person-hours is supplied to the client from the server via the network. It is therefore possible to perform the person-hour estimation without imposing a load on the client.

According to a third aspect of the present invention, there is provided a program for causing a computer to operate as: means for storing a correction table to set a correction coefficient in accordance with a total number of pins extending from parts to be integrated on a printed circuit board; means for storing a specification table to set a specification coefficient in accordance with a special specification to be applied to the printed circuit board; means for storing a wiring method table to set an increment/decrement coefficient in accordance with a wiring method to be used to make signal lines on the pattern film; means for storing a difficulty table to set a difficulty coefficient in accordance with a number of signal layers to be made in the printed circuit board, a number of signal lines arrangeable between adjacent pins and a pin density; means for referring to the correction table to obtain a correction coefficient on the basis of a total number of pins indicated in a design condition, referring to the specification table to obtain a specification coefficient on the basis of a special specification indicated in the design condition, and multiplying the total number of pins, correction coefficient and specification coefficient to calculate a number of reference pins; means for referring to the wiring method table to obtain an increment/decrement coefficient on the basis of a signal line wiring method indicated in the design condition, and calculating a number of additional pins on the basis of the obtained increment/decrement coefficient; means for referring to the difficulty table to obtain a difficulty coefficient on the basis of information included in the design condition, and correcting a sum of the number of the reference pins and the number of the additional pins on the basis of the difficulty coefficient and a reuse rate of a preceding wiring pattern, to calculate a total estimated number of pins; and means for calculating person-hours required to prepare a pattern film of the printed circuit by dividing the total estimated number of the pins by an average number of pins handleable by a design engineer per a unit time. Since the total estimated number of the pins is corrected and obtained in consideration of various design factors, it is possible to estimate the person-hours at high accuracy. Further, since various tables are included in the program, it is easy to take advantage of data and experiences used in and obtained from existing pattern films, without changing the estimation program.

DETAILED DESCRIPTION OF THE INVENTION

Embodiments of the present invention will be described in reference to the accompanying drawings.

Figure 1:
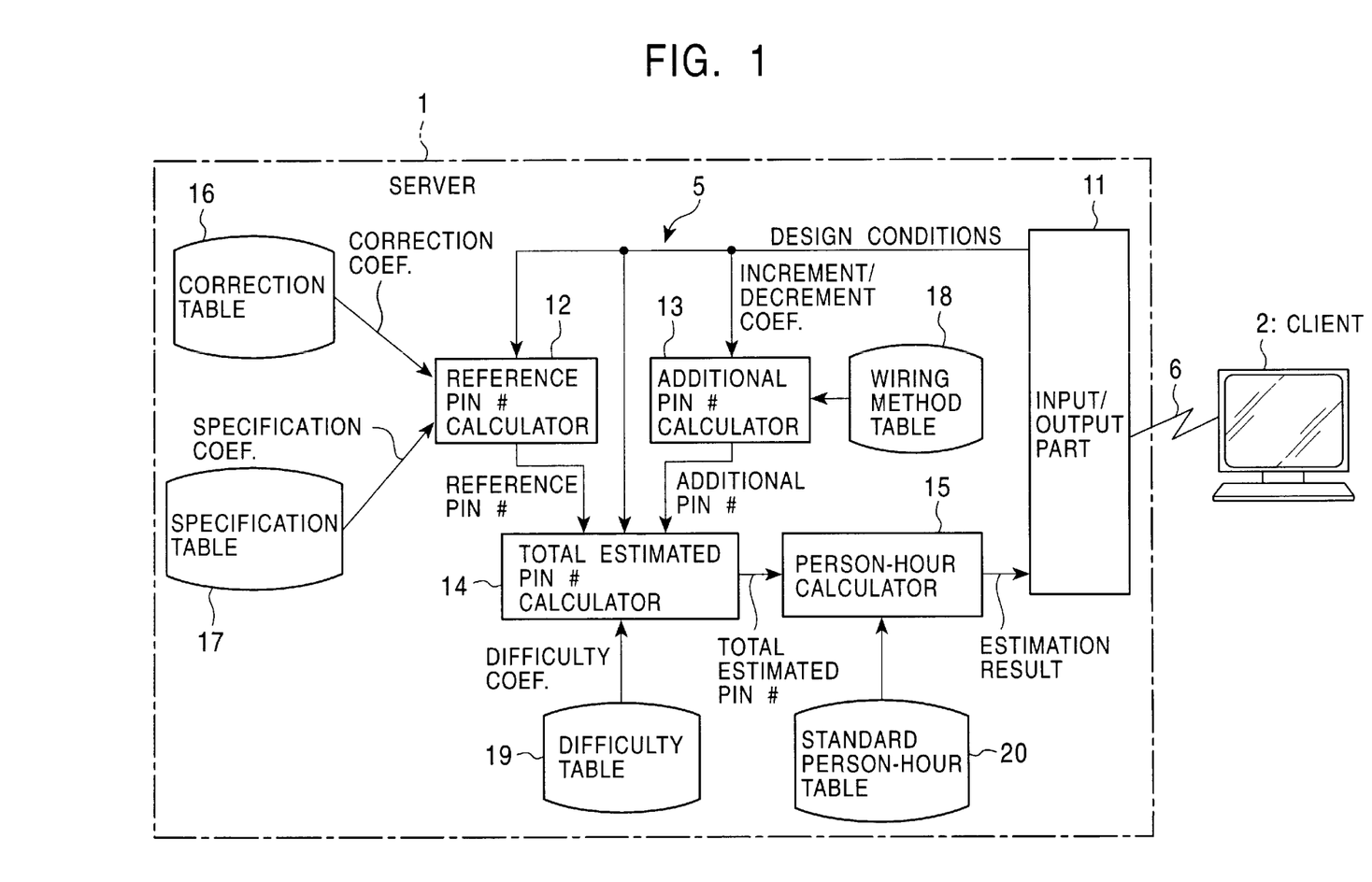
FIG. 1 illustrates a schematic block diagram of an estimation system according to one embodiment of the present invention.

Referring to FIG. 1, illustrated is an estimation system 5 according to one embodiment of the present invention. The estimation system 5 is provided in a server 1 of a client-server system connected by a network 6. The estimation system 5 calculates person-hours and period (days) required to create a pattern film of a printed circuit board, on the basis of design conditions (requirements) given from a client 2.

The estimation system 5 has an input/output part 11 to exchange data between the client 2 and the estimation system 5 (or the server 1). The data is input to and output from the estimation system 5 via the input/output part 11. A reference pin calculation unit 12 for calculating a number of reference pins, an additional pin calculation unit 13 for calculating a number of additional pins, a total estimated pin calculation unit 14 for calculating a total estimated number of pins and a person-hour calculation unit 15 for calculating person-hours are connected to the input/output part 11.

The reference pin calculation unit 12 calculates a reference number of the pins for the estimation procedure on the basis of the design conditions supplied from the client 2. The reference number is determined from a sum of pins (actual pins) of the parts to be arranged on the printed circuit board, as well as a special design specification applied to the printed circuit board. A correction table 16 and a specification table 17 are connected to the reference pin calculation unit 12.

Table I indicates an example of the correction table 16. Correction coefficients are set in relation to the sum of the pins (actual pins) of all the parts integrated on the printed circuit board.

TABLE I

(CORRECTION TABLE)

| Sum of Pins of All Parts | Correction Coefficient |
|---|---|
| 1 to 250 | 2.5 |
| 251 to 500 | 2.0 |
| 501 to 1000 | 1.5 |
| 1001 to 5000 | 1.0 |
| 5001 to 10000 | 0.8 |
| 10001 to 15000 | 0.7 |
| 15001 or more | 0.6 |

The person-hours required to prepare the pattern film of the printed circuit board depends upon the sum of the (actual) pins or all the parts to be arranged on the printed circuit board, but is not completely proportional to the sum of the pins of all the parts. Even if the sum of the pins of all the parts is small, a certain amount of person-hours is required. It is often called "minimum person-hours." On the other hand, even if the sum of the pins of all the parts increases, the person-hours do not increase proportionally. The correction coefficients are determined in view of these facts.

Table II shows an example of the specification table 17. Specification coefficients are set in relation to special design conditions to be applied to the printed circuit board.

TABLE II

(SPECIFICATION TABLE)

| Special Specification | Specification Coefficient |
|---|---|
| BWB Board | −0.2 |
| Overlay Wiring (1–40%) | 0.1 |
| Overlay Wiring (41–70%) | 0.2 |
| Overlay Wiring (71% or more) | 0.3 |
| 2-Layer Board | 0.2 |
| Paper-Based Board | 0.5 |
| Single Surface Integration | 1.0 |

When the BWB board, two-layer board or paper-based board should be used, or the overlay wiring or single-surface wiring should be made, different person-hours are required. The specification coefficients in Table II are experimentally determined in relation to the sum of the pins of all the parts (referred to as "total number of pins") on the printed circuit board. If more than one special specification should be applied to the printed circuit board, the specification coefficients are summed up.

The reference pin calculation unit 12 refers to the correction table 16 and specification table 17 on the basis of the design conditions supplied from the client 2, so as to obtain the correction coefficient and specification coefficient. The reference pin calculation unit 12 then calculates the number of the reference pins from the following equation (1):

of Reference Pins=(Total#of Pins)×Correction Coef.×(1+ΣSpecification Coef.)  (1)

The additional pin calculation unit 13 calculates the number of the additional pins on the basis of a signal line wiring method specified in the designed conditions supplied from the client 2. The person-hours vary with the wiring method. Increment or decrement in the person-hours depending upon the wiring method is converted to the above described "the number of the additional pins." It should be noted that the additional number can be a negative number. For instance, the value of the number of the additional pins is a negative number when automatic wiring is used. A wiring method table 18 is coupled to the additional pin calculation unit 13.

Table III shows an example of the wiring method table 18. Relationship between the wiring methods for the signal line and the increment/decrement coefficients applied to the number of the additional pins is present. Table III is prepared by experiments. The increase/decrease in the number of the additional pins corresponds to the increase/decrease in the person-hours.

TABLE III

(WIRING METHOD TABLE)

| Wiring Method | Coefficient For Unit Length |
|---|---|
| Guard Earth Wiring | 0.8 |
| Pair Wiring | 0.3 |
| Bus Wiring (10 or less) | 1.0 |
| Bus Wiring (11 to 20) | 1.2 |
| Bus Wiring (21 to 30) | 1.4 |
| Bus Wiring (31 or more) | 1.6 |
| Specified Wiring Length | 1.3 |
| Automatic Wiring | −0.6 |

As shown in Table III, when the wiring method is designated, a corresponding coefficient for a unit length of the wiring is decided. The coefficient is multiplied by the number of the unit lengths of the wiring. In general, a plurality of wiring methods are employed to fabricate a pattern film of a printed circuit board. Thus, the products of the coefficients and the numbers of the unit lengths for the respective wiring methods are summed up.

The additional pin calculation unit 13 obtains the coefficients from the wiring method table 18 on the basis of the design conditions sent from the client 2. The additional pin calculation unit 13 then calculates the number of the additional pins using the equation (2). The increase/decrease in the person-hours which depends upon the selected wiring method is reflected in the number of the additional pins.

of Additional Pins=Σ(Coef. Per Unit Length×#of Unit Lengths)(2)

The total estimated pin calculation unit 14 first calculates a sum of the number of the reference pins, which is calculated by the reference pin calculation unit 12, and the number of the additional pins, which is calculated by the additional pin calculation pin 13. The total estimated pin calculation unit 14 then corrects the sum with design difficulty. The design difficulty is determined by experiments in view of two factors. One factor is how many percentage of the wiring can be made from a previous wiring design (referred to as "reuse rates"). Data of existing wiring is stocked in a database, for example. When the same wiring can be used again for the currently working design, the data of the previous wiring is retrieved from the database. The other factor is how difficult the design is (referred to as "difficulty coefficient"). A difficulty table 19 is connected to the total estimated pin calculation unit 14 to supply the difficulty coefficient to the total estimated pin calculation unit 14. A reuse rate may be included in the design conditions supplied from the client 2 or supplied from a separate table.

Table IV shows one example of the difficulty table 19. The design difficulty is represented by the difficulty coefficients in the table IV. The difficulty coefficients are set in relation with the number of the signal layers to be made in the printed circuit board, a signal grade (the number of the signal lines arrangeable between adjacent pins, or wiring grade), and a pin density. In this particular embodiment, the pin density is the inverse of the density. The inverse of the density is an occupied area, which is obtained by dividing the wiring area by the total number of the pins.

TABLE IV (DIFFICULTY TABLE)

| Signal Layer- | Pin-Occupied Area (mm²/pin) | | | | | | | |
|---|---|---|---|---|---|---|---|---|
| Wiring Grade | -3 | -5 | -8 | -11 | -14 | -17 | -20 | 21- |
| 2 - 1 | 2.6 | 2.1 | 1.7 | 1.5 | 1.3 | 1.0 | 0.9 | 0.8 |
| 2 - 2 | 2.5 | 2.0 | 1.6 | 1.4 | 1.2 | 0.9 | 0.8 | 0.7 |
| 2 - 3 | 2.4 | 1.9 | 1.5 | 1.3 | 1.0 | 0.8 | 0.7 | 0.6 |
| 4 - 2 | 2.2 | 1.7 | 1.3 | 1.0 | 0.9 | 0.7 | 0.6 | 0.5 |
| 4 - 3 | 2.0 | 1.5 | 1.0 | 0.9 | 0.8 | 0.7 | 0.5 | 0.5 |
| 6 - 2 | 1.9 | 1.3 | 0.9 | 0.8 | 0.7 | 0.6 | 0.5 | 0.5 |
| 6 - 3 | 1.8 | 1.2 | 0.8 | 0.7 | 0.6 | 0.5 | 0.5 | 0.5 |
| 8 - 2 | 1.7 | 1.1 | 0.7 | 0.6 | 0.5 | 0.5 | 0.5 | 0.5 |
| 8 - 3 | 1.6 | 1.0 | 0.6 | 0.5 | 0.5 | 0.5 | 0.5 | 0.5 |

The total estimated pin calculation unit 14 refers to the difficulty table 19 on the basis of the design conditions supplied from the client machine 2, and obtains a difficulty coefficient. The total estimated pin calculation unit 14 then calculates the total estimated number of the pins from the equation (3):

Estimated Pin#=(Reference Pin#+Additional Pin#)×Difficulty Coef.×Redesign Coef.   (3)

The redesign coefficient (=1−Reuse Rate) indicates how much the existing design for the wiring should be modified when the existing design can be used somewhat for the currently developed pattern film for the printed circuit board. For example, if 10% of the available wiring pattern can be utilized again, the redesign coefficient becomes 0.9.

The person-hour calculation unit 15 calculates person-hours by dividing the total estimated pin number supplied from the total estimated pin calculation unit 14 by an average number of pins handled by a design engineer per a unit time (referred to as "average handleable pin #"). A standard person-hour table 20 is connected to the person-hour calculation unit 15.

The standard person-hour table 20 includes, for example, a table of an average number of the pins handled by the design engineer per a unit time, a table of person-hours required to test the pattern film with respect to the total number of the pins, and a table of additional person-hours required upon particular (additional) requirements from the client.

Table V shows an example of the table of person-hours required to test (examine) the pattern film. The person-hours are determined by experiments.

TABLE V (TEST PERSON-HOUR TABLE)

| Total # of Pins | Person-Hours (hr) |
|---|---|
| 1 to 250 | 1 |
| 251 to 500 | 2 |
| 501 to 1000 | 4 |
| 1001 to 5000 | 8 |

TABLE V-continued (TEST PERSON-HOUR TABLE)

| Total # of Pins | Person-Hours (hr) |
|---|---|
| 5001 to 10000 | 10 |
| 10001 to 15000 | 12 |
| 15001 or more | 15 |

The person-hour calculation unit 15 refers to the standard person-hour table 20 and calculates the person-hours and the total preparation period from the equations (4) and (5):

Person Hours=(Total Estimated Pin#/Average Handleable Pin#)+ Additional Person-Hours+Test Person-Hours   (4)

Preparation Period=(Person-Hours/Engineer Work Hour Coef.)+ Basic Days+Client Examination Days   (5)

The engineer work hour coefficient is a coefficient determined by whether the preparation of the pattern film of the printed circuit board is a rush job or not. If there is no rush, the coefficient is 8 (hours/day).

Figure 2:
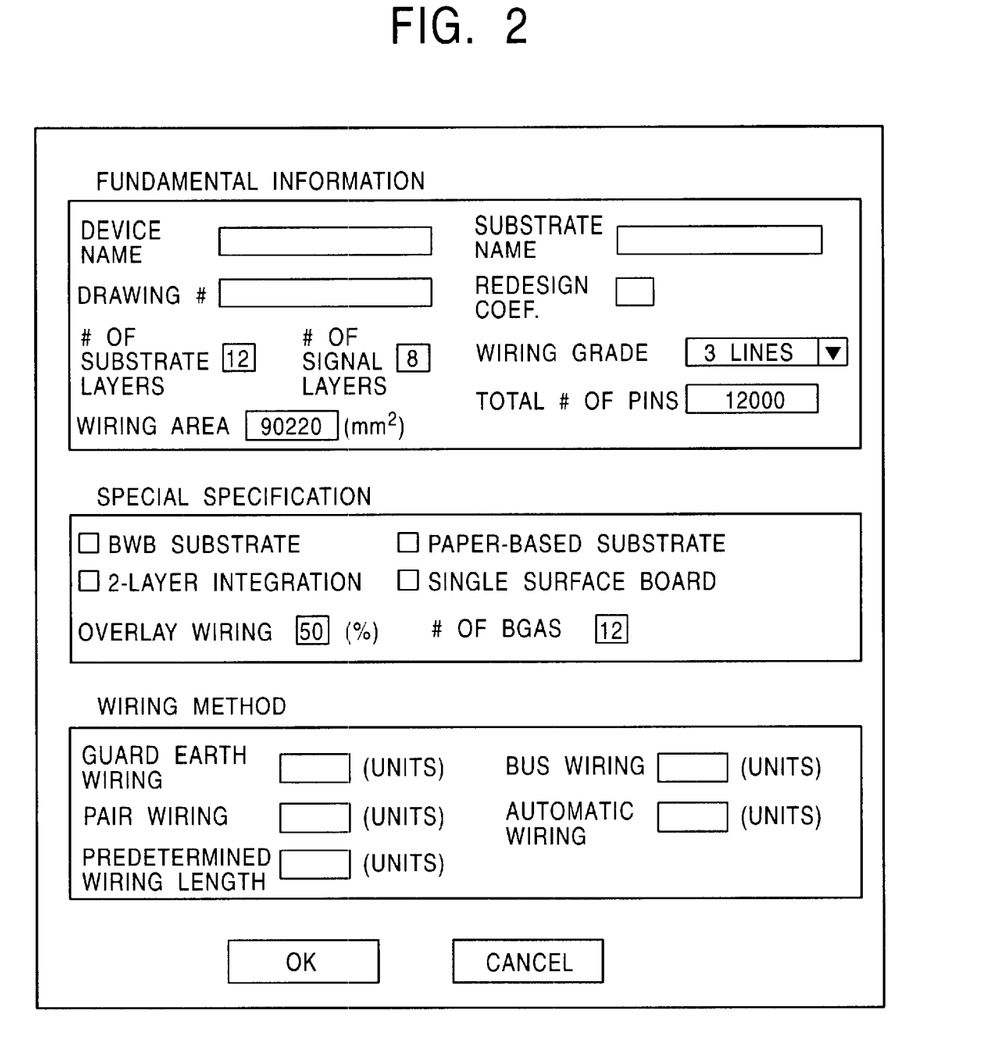
FIG. 2 illustrates a screen for design condition data entry, which is presented to a client of the estimation system shown in FIG. 1.
Figure 3:
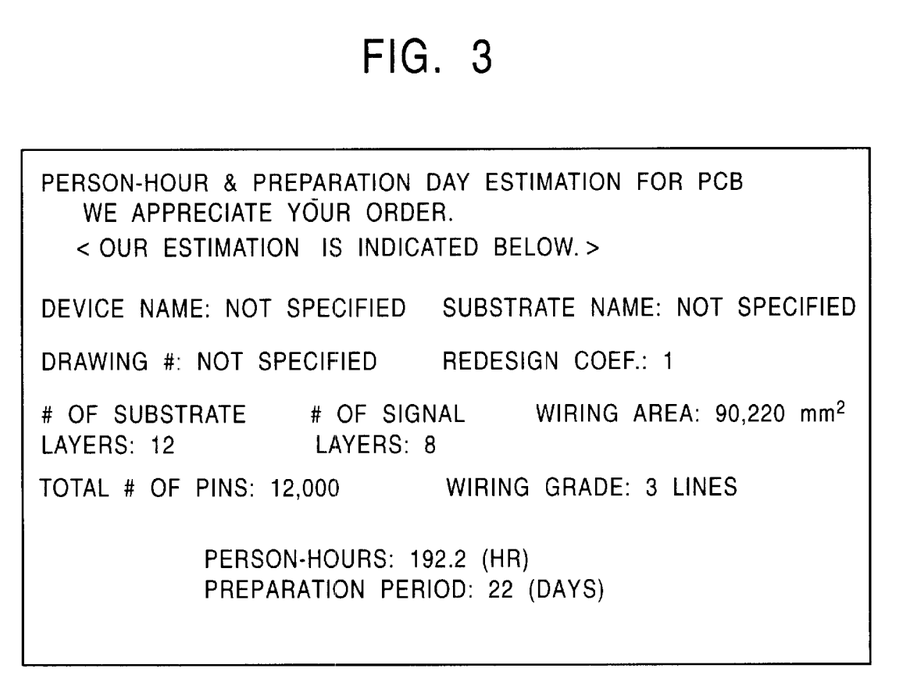
FIG. 3 illustrates a screen of estimation result, which is presented to the client.

Referring to FIG. 2, illustrated is an example of a data entry screen to input the design conditions. FIG. 3 illustrates a screen to show the result of the estimation. The operation of the estimation system 5 shown in FIG. 1 will be described in reference to FIGS. 2 and 3.

When the client machine 2 accesses the estimation system 5 in the server 1, the estimation system 5 provides the client 2 with the data entry screen shown in FIG. 2.

The client machine 2 (in actuality, an operator of the client machine 2) inputs data into a fundamental information section, a special specification section and a wiring method section of the screen, and presses an OK button. In general, pressing the OK button is carried out by clicking "OK" in the screen with a mouse. Upon clicking "OK", the entered design conditions are sent to the estimation system 5.

The design conditions from the client machine 2 are received at the input/output part 11 of the estimation system 5, and transferred to the reference pin calculation unit 12, the additional pin calculation unit 13 and the total estimated pin calculation unit 14 respectively.

The reference pin calculation unit 12 refers to the correction table 16 on the basis of the total number of the pins indicated in the basic information section of the design condition data to obtain a correction coefficient. The reference pin calculation unit 17 also refers to the specification table 17 on the basis of the special specification data indicated in the special specification section of the design condition data to obtain a specification coefficient. The design condition data may include more than one special specification. The reference pin calculation unit 12 calculates the number of the reference pins in accordance with the equation (1) using the total pin number, the correction coefficient and the specification coefficient(s).

The additional pin calculation unit 13 refers to the wiring method table 18 on the basis of the wiring method data indicated in the design condition data to obtain an increment/decrement coefficient per a unit length for each of the designated wiring methods. The additional pin calculation unit 13 then calculates the number of the additional pins in accordance with the equation (2) using the increment/decrement coefficients and the number of unit lengths mentioned in the wiring method section of the design condition data for the respective wiring methods.

The number of the reference pins calculated by the reference pin calculation unit 12 and the number of the additional pins calculated by the additional pin calculation unit 13 are supplied to the total estimated pin calculation unit 14.

The total estimated pin calculation unit 14 calculates the area occupied by the pins from the equation (6) below, on the basis of the wiring area and total pin number indicated in the basic information section of the design condition data.

$$\text{Pin-Occupied Area} = \text{Wiring Area/Total Pin\#} \tag{6}$$

The total estimated pin calculation unit 14 refers to the difficulty table 19 on the basis of the calculated pin-occupied area as well as the number of the signal layers and the wiring grade indicated in the basic information section of the design condition data to obtain a difficulty coefficient. In the meantime, the total estimated pin calculation unit 14 retrieves the redesign coefficient indicated in the basic information section of the design condition data. The total estimated pin calculation unit 14 calculates the total estimation number of the pins in accordance with the equation (3). The calculated total estimated pin number is supplied to the person-hour calculation unit 15.

The person-hour calculation unit 15 refers to the standard person-hour table 20, and calculates the design person-hours in accordance with the equation (4) and the period (days) to complete the preparation of the pattern film of the printed circuit board in accordance with the equation (5). The calculation results are the estimation results and returned to the client machine 2 via the input/output part 11.

The client machine 2 therefore receives the screen of the estimation results as shown in FIG. 3.

In this manner, the estimation system 5 of this embodiment calculates the total estimated number of the pins on the basis of the total number of the actual pins to be made on the printed circuit board while utilizing the special specification, wiring methods and the like, and calculates the person-hours and necessary days to complete the preparation of the pattern film of the printed circuit board on the basis of the total estimated number of the pins. As a result, it is possible to provide highly reliable estimation even if a considerable portion of the pattern film for the printed circuit should be made manually. As mentioned earlier, a high-speed, high-density printed circuit requires a substantial amount of manual design. It was confirmed by a sampling approach that deviation between the estimation results and actual person-hours was less than 5%.

In the illustrated embodiment, various coefficients utilized in obtaining the total estimated number of the pins are stored in the tables. It is therefore possible to easily take advantage of preceding design and estimation data and experiences when calculating the total estimated number of the pins, by only replacing the tables with new ones, without modifying the estimation program. Accordingly, it is feasible to readily cope with design modifications.

It should be noted that the present invention is not limited to the above described embodiment. For example, the estimation system 5 is not necessarily located inside the server 1 of the client-server system. The estimation system may be present in the form of a program executed by a controller in a personal computer. The reference pin calculation unit 12 does not necessarily obtain the correction coefficient from the correction table 16. The reference pin calculation unit 12 may calculate the correction coefficient with a function that has the total number of the pins as a variable. The estimated pin calculation unit 14 does not necessarily obtain the difficulty coefficient from the difficulty table 19. The estimated pin calculation unit 14 may calculate the difficulty coefficient with a function that has the signal layer number, wiring grade and pin-occupied area (or pin density) as variables.

In addition, the client machine 2 does not have to enter all the design conditions into the data entry screen. The design data obtainable from the circuit design, which is prepared by the client at the initial stage of the pattern film preparation, may be supplied to the estimation system. In such a case, the client machine 2 may only be required to input the drawing number. This greatly simplifies the data entry operation on the client side, and prevents an data entry error.

The format and items to be entered as the design conditions are not limited to those shown in FIG. 2. Likewise, the format and items to be shown in the estimation result screen are not limited to those shown in FIG. 3.

What is claimed is:

1. An estimation system for estimating person-hours required to prepare a pattern film of a circuit to be printed on a board, the estimation system comprising:

a reference pin calculation unit for calculating a number of reference pins on the basis of a total number of pins extending from parts to be integrated on a printed circuit board and a special specification requirement to be applied to a printed circuit;

an additional pin calculation unit for calculating a number of additional pins on the basis of a signal line wiring method used in preparing a pattern film for the printed circuit;

a total estimated pin calculation unit for correcting a sum of the number of the reference pins and the number of the additional pins on the basis of design difficulty, which is determined from a number of signal layers to be made in the printed circuit, a number of signal lines arrangeable between adjacent pins and a pin density, to calculate a total estimated number of pins; and a person-hour calculation unit for calculating person-hours required to prepare a pattern film of the printed circuit by dividing the total estimated number of the pins by an average number of pins handleable by a design engineer per a unit time.

2. The estimation system according to claim 1, wherein the total estimated pin calculation unit considers a redesign coefficient when correcting the sum of the number of the reference pins and the number of the additional pins.

3. The estimation system according to claim 1, wherein the number of the additional pins can be a negative number.

4. The estimation system according to claim 1, wherein the person-hour calculation unit considers a time required to test the pattern film when calculating the person-hours.

5. An estimation system for estimating person-hours required to prepare a pattern film for a printed circuit board based on a design condition, the estimation system comprising:

a correction table for setting a correction coefficient in accordance with a total number of pins extending from parts to be integrated on a printed circuit board;

a specification table for setting a specification coefficient in accordance with a special specification to be applied to the printed circuit board;

a wiring method table for setting an increment/decrement coefficient in accordance with a wiring method of signal lines to be made on the printed circuit board;

a difficulty table for setting a difficulty coefficient in accordance with a number of signal layers to be made on the printed circuit board, a number of signal lines arrangeable between adjacent pins and a pin density;

a reference pin calculation unit for referring to the correction table to obtain a correction coefficient on the basis of a total number of pins indicated in the required design condition, referring to the specification table to obtain a specification coefficient on the basis of a special specification indicated in the required design condition, and multiplying the total number of pins, the obtained correction coefficient and the obtained specification coefficient to calculate a number of reference pins;

an additional pin calculation unit for referring to the wiring method table to obtain an increment/decrement coefficient on the basis of a signal line wiring method indicated in the required design condition, and calculating a number of additional pins on the basis of the obtained increment/decrement coefficient;

a total estimated pin calculation unit for referring to the difficulty table to obtain a difficulty coefficient on the basis of information included in the required design condition, and correcting a sum of the number of the reference pins and the number of the additional pins on the basis of the difficulty coefficient and a reuse rate of a preceding wiring pattern, to calculate a total estimated number of pins; and a person-hour calculation unit for calculating the person-hours required to prepare a pattern film of the printed circuit by dividing the total estimated number of the pins by an average number of pins handleable by a design engineer per a unit time.

6. The estimation system according to claim 5, wherein the estimation system is included in a server of a server-client system, the server is connected to the client via a network, the design condition is supplied to the server from the client via the network, and the correction table, specification table, wiring method table, difficulty table, reference pin calculation unit, additional pin calculation unit, total estimated pin calculation unit and person-hour calculation unit are included in the server, whereby the estimated person-hours is supplied to the client from the server via the network.

7. The estimation system according to claim 5, wherein the number of the additional pins can be a negative number.

8. The estimation system according to claim 5, wherein the person-hour calculation unit considers a time required to test the pattern film when calculating the person-hours.

9. A computer executed program operable:

means for storing a correction table to set a correction coefficient in accordance with a total number of pins extending from parts to be integrated on a printed circuit board;

means for storing a specification table to set a specification coefficient in accordance with a special specification to be applied to the printed circuit board;

means for storing a wiring method table to set an increment/decrement coefficient in accordance with a wiring method of signal lines to be made on the printed circuit board;

means for storing a difficulty table to set a difficulty coefficient in accordance with a number of signal layers to be made on the printed circuit board, a number of signal lines arrangeable between adjacent pins and a pin density;

means for referring to the correction table to obtain a correction coefficient on the basis of a total number of pins indicated in a design condition, referring to the specification table to obtain a specification coefficient on the basis of a special specification indicated in the design condition, and multiplying the total number of pins, the obtained correction coefficient and the obtained specification coefficient to calculate a number of reference pins;

means for referring to the wiring method table to obtain an increment/decrement coefficient on the basis of a signal line wiring method indicated in the design condition, and calculating a number of additional pins on the basis of the obtained increment/decrement coefficient;

means for referring to the difficulty table to obtain a difficulty coefficient on the basis of information included in the design condition, and correcting a sum of the number of the reference pins and the number of the additional pins on the basis of the difficulty coefficient and a reuse rate of a preceding wiring pattern, to calculate a total estimated number of pins; and means for calculating person-hours required to prepare a pattern film of the printed circuit by dividing the total estimated number of the pins by an average number of pins handleable by a design engineer per a unit time.

10. The program according to claim 9, wherein the number of the additional pins can be a negative number.

11. The program according to claim 9, wherein the means for calculating the person-hours considers a time required to test the pattern film when calculating the person-hours.

12. An estimation apparatus comprising:

first means for calculating a number of reference pins on the basis of a total number of pins extending from parts to be integrated on a printed circuit board and a special specification requirement to be applied to a printed circuit;

second means for calculating a number of additional pins on the basis of a signal line wiring method used in preparing a pattern film of the printed circuit;

third means for correcting a sum of the number of the reference pins and the number of the additional pins on the basis of design difficulty to calculate a total estimated number of pins; and fourth means for calculating person-hours required to prepare a pattern film of the printed circuit by dividing the total estimated number of the pins by an average number of pins handleable by a design engineer per a unit time.

13. The estimation apparatus according to claim 12, wherein the third means considers a redesign coefficient when correcting the sum of the number of the reference pins and the number of the additional pins.

14. The estimation apparatus according to claim 12, wherein the number of the additional pins can be a negative number.

15. The estimation apparatus according to claim 12, wherein the fourth means considers a time required to test the pattern film when calculating the person-hours.

16. The estimation apparatus according to claim 12, wherein the design difficulty is determined from a number of signal layers to be made in the printed circuit, a number of signal lines arrangeable between adjacent pins and a pin density.

17. An estimation method of estimating person-hours required to prepare a pattern film for a printed circuit board based on a design condition, the estimation method comprising the steps of:

A) calculating a number of reference pins on the basis of a total number of pins extending from parts to be integrated on a printed circuit board and a special specification requirement indicated in the design condition;

B) calculating a number of additional pins on the basis of a signal line wiring method indicated in the design condition;

C) correcting a sum of the number of the reference pins and the number of the additional pins on the basis of design difficulty to calculate a total estimated number of pins; and D) calculating the person-hours required to prepare a pattern film of the printed circuit by dividing the total estimated number of the pins by an average number of pins handleable by a design engineer per a unit time.

18. The estimation method according to claim 17, wherein the step C utilizes a redesign coefficient when correcting the sum of the number of the reference pins and the number of the additional pins.

19. The estimation method according to claim 17, wherein the number of the additional pins can be a negative number.

20. The estimation method according to claim 17, wherein the step D utilizes a time required to test the pattern film when calculating the person-hours.

21. The estimation method according to claim 17, wherein the design difficulty is determined from a number of signal layers to be made on the printed circuit, a number of signal lines arrangeable between adjacent pins and a pin density.

* * * * *